(12) United States Patent
Miks et al.

(10) Patent No.: US 7,102,214 B1
(45) Date of Patent: Sep. 5, 2006

(54) PRE-MOLDED LEADFRAME

(75) Inventors: Jeffrey Alan Miks, Chandler, AZ (US); Ronald James Schoonejongen, Tucson, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 239 days.

(21) Appl. No.: 10/923,575

(22) Filed: Aug. 20, 2004

Related U.S. Application Data

(63) Continuation of application No. 10/329,620, filed on Dec. 26, 2002, now Pat. No. 6,798,047.

(51) Int. Cl.
H01L 23/495 (2006.01)

(52) U.S. Cl. ............... 257/670; 257/671; 438/123

(58) Field of Classification Search .......... 257/670, 257/671; 438/123
See application file for complete search history.

(56) References Cited

U.S. PATENT DOCUMENTS

| | | | |
|---|---|---|---|
| 3,668,299 A | 6/1972 | Mc Neal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papaietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota et al. |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 6,040,622 A | 3/2000 | Wallace |
| 6,143,981 A | 11/2000 | Glenn |
| D445,096 S | 7/2001 | Wallace |
| D446,525 S | 8/2001 | Okamoto et al. |
| 6,384,472 B1 | 5/2002 | Huang |
| 6,462,273 B1 | 10/2002 | Corisis et al. |
| 6,476,469 B1 | 11/2002 | Hung et al. |
| 6,545,332 B1 | 4/2003 | Huang |
| 6,603,196 B1 | 8/2003 | Lee et al. |
| 6,624,005 B1 | 9/2003 | DiCaprio et al. |
| 2002/0140068 A1 | 10/2002 | Lee |

FOREIGN PATENT DOCUMENTS

| | | |
|---|---|---|
| JP | 3112688 | 5/1991 |
| JP | 7017175 | 1/1995 |
| JP | 8190615 | 7/1996 |
| JP | 10334205 | 12/1998 |

*Primary Examiner*—Douglas W. Owens
(74) *Attorney, Agent, or Firm*—Stetina Brunda Garred & Brucker

(57) ABSTRACT

A semiconductor package comprising a substrate which includes a leadframe having a plurality of leads which each define opposed top and bottom surfaces and extends in spaced relation to each other such that gaps are defined therebetween. The substrate further comprises a compound layer which is filled within the gaps defined between the leads. The substrate includes a continuous, generally planar top surface collectively defined by the top surfaces of the leads and compound layer, and a continuous, generally planar bottom surface collectively defined by the bottom surfaces of the leads and compound layer. Attached to the top surface is a semiconductor die which is electrically connected to at least some of the leads.

19 Claims, 4 Drawing Sheets

PRE-MOLDED LEADFRAME

CROSS-REFERENCE TO RELATED APPLICATIONS

The present application is a continuation of U.S. application Ser. No. 10/329,620 entitled PRE-MOLDED LEADFRAME filed Dec. 26, 2002 now U.S. Pat. No. 6,798,047.

STATEMENT RE: FEDERALLY SPONSORED RESEARCH/DEVELOPMENT (Not Applicable)

BACKGROUND OF THE INVENTION

1. Field of the Invention

The present invention relates generally to integrated circuit chip package technology and, more particularly, to a pre-molded leadframe which is molded in a flat configuration and is adapted for usage in package applications requiring flat substrate technology.

2. Description of the Related Art

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package.

The leadframe is the central supporting structure of such a package. A portion of the leadframe is internal to the package, i.e., completely surrounded by the plastic encapsulant. Portions of the leads of the leadframe extend externally from the package or are partially exposed within the encapsulant material for use in electrically connecting the chip package to another component.

For purposes of high-volume, low-cost production of chip packages, a current industry practice is to etch or stamp a thin sheet of metal material to form a panel or strip which defines multiple leadframes. A single strip may be formed to include multiple arrays, with each such array including a multiplicity of leadframes in a particular pattern. In a typical semiconductor package manufacturing process, the integrated circuit dies are mounted and wire bonded to respective ones of the leadframes, with the encapsulant material then being applied to the strips so as to encapsulant the integrated circuit dies, bond wires, and portions of each of the leadframes in the above-described manner.

Upon the hardening of the encapsulant material, the leadframes within the strip are cut apart or singulated for purposes of producing the individual semiconductor packages. Such singulation is typically accomplished via a saw singulation process. In this process, a saw blade is advanced along "saw streets" which extend in prescribed patterns between the leadframes as required to facilitate the separation of the leadframes from each other in the required manner.

In current, conventional leadframe design, the leadframe does not define a continuous, uninterrupted surface. Rather, individual leads of the leadframe are separated from each other and from the peripheral edge of a die pad (if included in the leadframe) by narrow gaps. The die pad of the leadframe, if included therein, is the supporting structure to which the die is typically attached.

It is known in the electronics industry that certain semiconductor package applications (e.g., vision packages) require flat substrate technology. In the specific case of vision packages, the active area of the die electrically connected to the substrate via bond wires cannot be inhibited, and thus cannot be overmolded with a clear plastic encapsulant or compound. In such packages, an optical subassembly is placed over the die and attached to the substrate. The above-described leadframe is typically not suited for use in a vision package application since the optical subassembly requires a generally continuous, planar surface for proper mounting not provided by a conventional leadframe design.

The present invention specifically addresses this deficiency by providing a leadframe that is subjected to a molding process wherein a mold compound is effectively filled within the gaps or spaces between the leads, and between the leads and the die pad (if included). As a result of this molding operation, the filled leadframe defines opposed, generally planar and continuous top and bottom surfaces which allows the same to be used in those package applications requiring flat substrate technology. In the case of vision packages, such filled leadframe can be used as a replacement for two-layer ceramics and/or two-layer PCB substrates typically required for such applications. Thus, the present invention has the advantage of substantially reducing complexity in the manufacturing process, and thus its related costs. These, as well as other features and advantages of the present invention, will be discussed in more detail below.

BRIEF SUMMARY OF THE INVENTION

In accordance with the present invention, there is provided a semiconductor package comprising a substrate which includes a leadframe having a plurality of leads which each define opposed, generally planar top and bottom surfaces and extend in spaced relation to each other such that gaps are defined therebetween. The substrate further comprises a compound layer which is filled within the gaps defined between the leads, and itself defines opposed, generally planar top and bottom surfaces. The substrate includes a continuous, generally planar top surface collectively defined by the top surfaces of the leads and compound layer, and a continuous, generally planar bottom surface collectively defined by the bottom surfaces of the leads and compound layer. Attached to the top surface is a semiconductor die which is electrically connected to the top surfaces of at least some of the leads via conductive wires.

The substrate of the present invention is adapted for use in those package applications requiring flat substrate technology. One such package is a vision package wherein the substrate can be used as a replacement for two-layer ceramics and/or two-layer PCB substrates typically required for such application.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
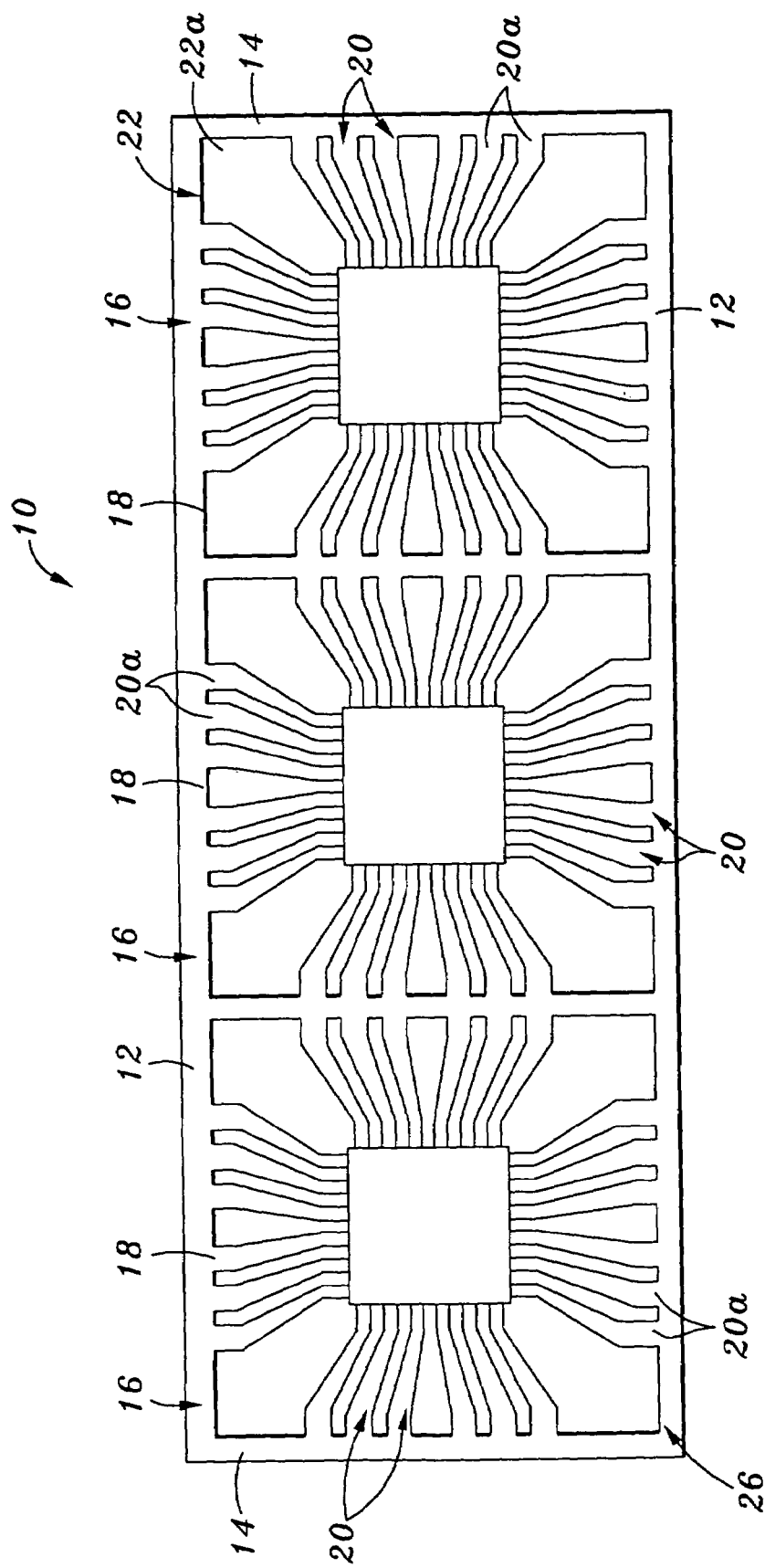
FIG. 1 is a top plan view of a leadframe strip defining multiple substrates formed in accordance with a first embodiment of the present invention.

Referring now to the drawings wherein the showings are for purposes of illustrating preferred embodiments of the present invention only, and not for purposes of limiting the same, FIG. 1 depicts a leadframe strip 10 constructed in accordance with the present invention. The strip 10 has a generally rectangular configuration, defining an opposed pair of longitudinal peripheral edge segments 12 and an opposed pair of lateral peripheral edge segments 14. The strip 10 defines a multiplicity of leadframes 16. As shown in FIG. 1, the strip 10 defines three leadframes 16 disposed in side-by-side relation to each other. However, those of ordinary skill in the art will recognize that the inclusion of three leadframes 16 in the strip 10 is exemplary only, and that the strip 10 may be fabricated to define any number of leadframes 16 arranged in a multiplicity of different configurations or arrays without departing from the spirit and scope of the present invention.

Each leadframe 16 comprises a generally square outer frame portion 18 which defines an interior opening. Each leadframe 16 further comprises a multiplicity of leads 20 which are integrally connected to the outer frame portion 18 and protrude therefrom into the opening. The leads 20 are segregated into four sets, with the leads 20 of each set being sized and configured in a manner wherein the inner ends thereof collectively define a generally square-shaped region which is disposed in the approximate center of the opening defined by the corresponding outer frame portion 18. The leads 20 of each set extend in spaced relation to each other, with narrow gaps being defined therebetween.

Though not shown, each leadframe 16 may further comprise a die pad disposed within the central region collectively defined by the inner ends of the leads 20. If included in each leadframe 16, the die pad itself would preferably have a generally square configuration, and be sized and configured such that the inner ends of the leads 20 of each set within the corresponding leadframe 16 are disposed in spaced relation to respective ones of the four peripheral edge segments defined by the die pad, i.e., a continuous, generally square gap or space is defined between the inner ends of the leads 20 and such die pad. If a die pad is included within the leadframe 16, the same is typically attached to the corresponding outer frame portion 18 by from one to four tie bars which extend to the outer frame portion 18 from respective ones of the four corner regions defined by the die pad.

Figure 2:
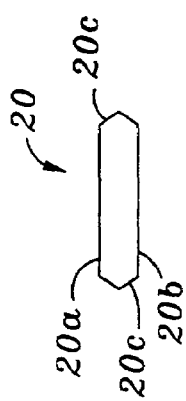
FIG. 2 is a cross-sectional view of one of the leads of one of the leadframes shown in FIG. 1, taken along line 2—2 of FIG. 1.

Referring now to FIGS. 1 and 2, the leadframe strip 10, and hence the individual leadframes 16 defined thereby, is preferably manufactured from a conductive metal material, such as copper, through the use of either a chemical etching or a mechanical stamping process. Chemical etching (also known as chemical milling) is a process that uses photolithography and metal dissolving chemicals to etch a pattern into a metal strip. A photoresist is exposed to ultraviolet light through a photomask having a desired pattern, and is subsequently developed and cured. Chemicals are sprayed or otherwise applied to the masked strip, and exposed portions of the strip are etched away, leaving the desired pattern. Mechanical stamping uses sets of progressive dies to mechanically remove metal from a metal strip. Each of a plurality of stamping stations uses one of the dies to punch a distinct small area of metal from the strip as the strip moves through the stations. The strip 10 may be formed by chemically etching rolled strip metal stock from both sides uses conventional liquid etchant.

As best seen in FIG. 2, the formation of the leadframes 16 within the strip 10 by the application of etching chemicals to both sides of the strip 10 results in each of the leads 20 of each leadframe 16 having the general cross-sectional configuration shown in FIG. 2. In this respect, chemically etching the leadframes 16 from both sides of the strip 10 results in the central portion of each lead 20 being slightly wider than each of the opposed top and bottom surfaces 20a, 20b of such lead 20. More particularly, each lead 20 has a generally trapezoidal cross-sectional configuration, defining opposed side surfaces 20c which each have an angled or pointed configuration. As indicated above, these structural attributes of the side surfaces 20c of each lead 20 constitute artifacts or features which normally occur as a result of chemically etching the strip 10 from both sides to form the leadframes 16. If, on the other hand, the leadframes 16 are formed through the implementation of a mechanical stamping process, other artifacts such as burrs are formed on the opposed side surfaces of each lead 20. Thus, irrespective of whether a chemical etching or mechanical stamping process is employed to facilitate the formation of the leadframes 16, the side surfaces of each lead 20 generally do not extend in perpendicular relation between the top and bottom surfaces 20a, 20b thereof. The artifacts (pointed side surfaces 20c or burrs) remaining on the leads 20 as a result of the chemical etching or mechanical stamping process comprise useful structural features in the present invention, as will be described in more detail below.

Referring again to FIG. 1, in the fully etched or stamped leadframe strip 10 defining the leadframes 16, the top surfaces 20a of the leads 20 extend in generally co-planar relation to each other and to the top surfaces of the outer frame portions 18. Similarly, the bottom surfaces 20b of the leads 20 extend in generally co-planar relation to each other and to the bottom surfaces of the outer frame portions 18. Thus, the leadframe strip 10 and the leadframes 16 defined thereby are devoid of any downsets. However, as also indicated above, the leads 20 of each set are separated from each other by relatively narrow gaps, with each set of leads 20 in each leadframe 16 being separated from each other by a substantially wider gap. The inner ends of the leads 20 of each leadframe 16 also do not contact each other, but rather collectively define and extend about the periphery of the generally square open central region of each leadframe 16. Thus, none of the leadframes 16 within the leadframe strip 10 define continuous, generally planar top and bottom surfaces due to the existence of the spaces or gaps between the leads 20, as well as the open central region defined by the inner ends of the leads 20. As indicated above, these gaps or spaces would otherwise make each leadframe 16 unsuitable for use in certain package applications requiring flat substrate technology.

To address this deficiency, the strip 10, subsequent to the completion of the chemical etching or mechanical stamping process to form the leadframes 16, is preferably subjected to a molding operation which effectively fills the spaces or gaps defined between the leads 20 and the square open central region of each leadframe 16 with a layer 22 of a plastic encapsulant or compound, as also seen in FIG. 1. A compound layer 22 is applied within the outer frame portion 18 of each leadframe 16, and is unitary, i.e., that portion filling the square central region is continuous with those portions extending between the leads 20 of each set and between each set of leads 20. Thus, the peripheral boundary of each compound layer 22 is the outer frame portion 18 of the corresponding leadframe 16. The compound layer 22 of each leadframe 16 is preferably formed to be of a thickness such that the top surface 22a of each compound layer 22 extends in generally co-planar relation to the top surfaces 20a of the leads 20 and the top surface of the corresponding outer frame portion 18, with the bottom surface 22b of each compound layer 22 extending in generally co-planar relation to the bottom surfaces 20b of the leads 20 and the bottom surface of the outer frame portion 18 of the corresponding leadframe 16. However, one or both of the opposed, generally planar top and bottom surfaces 22a, 22b of each compound layer 22 may be disposed slightly above or slightly below the corresponding top and bottom surfaces 20a, 20b of the leads 20.

Upon the application of the compound layer 22 to each leadframe 16, the side surfaces 20c of each of the leads 20 are effectively covered or encapsulated by the compound layer 22. Advantageously, the formation of the side surfaces 20c to include pointed ends as a result of the implementation of the chemical etching process described above facilitates a mechanical interlock between the leads 20 of each leadframe 16 and the corresponding compound layer 22 as assists in preventing any dislodgement or separation of the compound layer 22 from the associated leadframe 16. In the event a mechanical stamping process is employed to facilitate the formation of the leadframe 16, the above-described burrs formed on the side surfaces of the leads 20 as a result of the stamping operation create the above-described mechanical interlock when encapsulated or covered by the corresponding compound layer 22. Thus, as indicated above, the "artifacts" remaining on the side surfaces of the leads 20 as a result of the mechanical stamping or chemical etching process serve the useful function of strengthening the adhesion between each compound layer 22 and the leads 20 of the corresponding leadframe 16.

It will be recognized that if a die pad is included within each leadframe 16, each compound layer 22 will fill the generally square space or gap defined between the peripheral edge of the die pad 22 and the inner ends of the leads 20. Additionally, the top and bottom surfaces 22a, 22b of each compound layer 22 will preferably extend in generally co-planar relation to respective ones of the opposed, generally planar top and bottom surfaces of such die pad. The above-described artifacts will also be included on the peripheral side surfaces of the die pad, thus strengthening the adhesion between the same and the corresponding compound layer 22.

Those of ordinary skill in the art will recognize that the chemical etching or mechanical stamping process used to facilitate the formation of the leadframes 16 within the leadframe strip 10 may be conducted in a manner facilitating the formation of specifically shaped recesses or protuberances in or upon each of the leads 20 (and die pad if included) to facilitate an increased mechanical interlock between the compound layers 22 and the corresponding leadframes 16. Examples of such features are described in Applicant's U.S. Pat. No. 6,143,981 entitled PLASTIC INTEGRATED CIRCUIT PACKAGE AND METHOD AND LEADFRAME FOR MAKING THE PACKAGE issued Nov. 7, 2000, the disclosure of which is incorporated herein by reference.

Figure 3:
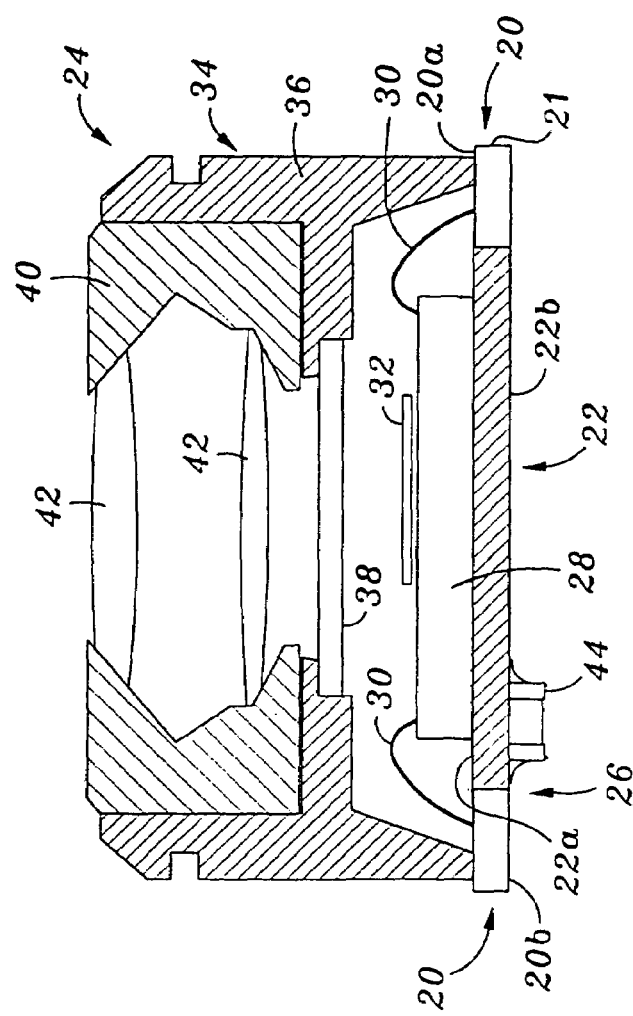
FIG. 3 is a side-elevational view of an exemplary semiconductor package assembled through the use of a substrate formed in accordance with the first embodiment of the present invention.

Referring now to FIG. 3, there is shown an exemplary semiconductor package 24 which includes a substrate 26 constructed in accordance with the present invention. The substrate 26 comprises a combination of one leadframe 16 and the corresponding compound layer 22 from the above-described strip 10. In the singulation process used to facilitate the separation of the leadframes 16 from each other within the leadframe strip 10, the outer frame portion 18 of each leadframe 16 is removed. Thus, in the resulting substrate 26 (which does not include the outer frame portion 18 of the corresponding leadframe 16), the outer, distal ends 21 of the leads 20 extend to respective ones of the four peripheral edge segments defined by the generally square substrate 26, the peripheral edge segments thus being collectively defined by the compound layer 22 and the outer ends 21 of the leads 20.

The semiconductor package 24 shown in FIG. 3 is referred to as a "vision package". In this semiconductor package 24, a semiconductor die 28 is attached to the top surface 22a of the compound layer 22, and in particular to that portion of the compound layer 22 filled within the square central region defined by the inner ends of the leads 20. Those of ordinary skill in the art will recognize that the semiconductor die 28 could alternatively be attached to the top surface of the die pad if included in the leadframe 16 of the substrate 26. The semiconductor die 28 includes conductive contacts or terminals which are electrically connected to the top surfaces 20a of respective ones of the leads 20 through the use of conductive wires 30. Included on the top, exposed surface of the semiconductor die 28 is an active area 32.

The semiconductor package 24 further comprises an optical subassembly 34 which is mounted to the substrate 26 and, more particularly, to the peripheral portions of the top surfaces 20a of the leads 20 and the top surface 22a of the compound layer 22. The optical subassembly 34 comprises a lens mount 36 which is mounted to the aforementioned surfaces of the substrate 26, and includes an integral glass window 38. The lens mount 36 is sized and configured to accommodate a focus and lock member 40 which is mounted therein. The focus and lock member 40 includes a pair of lenses 42 which are maintained in spaced relation to each other. When the focus and lock member 40 is mounted to the lens mount 36, a continuous optical path is defined by the lenses 42 and window 38. In this regard, as seen in FIG. 3, the optical subassembly 34 is itself mounted to the substrate 26 such that the active area 32 of the semiconductor die 28 lies within the optical path collectively defined by the window 38 and lenses 42. The semiconductor package 24 may optionally include a passive component 44 which is attached to the underside of the substrate 26.

The ability to mount the optical subassembly 34 to the substrate 26 in the semiconductor package 24 is made possible by the substrate 26 defining opposed, continuous and generally planar top and bottom surfaces attributable to the "fill" of the compound layer 22 within the spaces or gaps defined between the leads 20 of the substrate 26. As indicated above, the described usage within a vision package type semiconductor package 24 is exemplary only, in that the substrate 26 can also be configured for usage in any package application requiring flat substrate technology.

Figure 4:
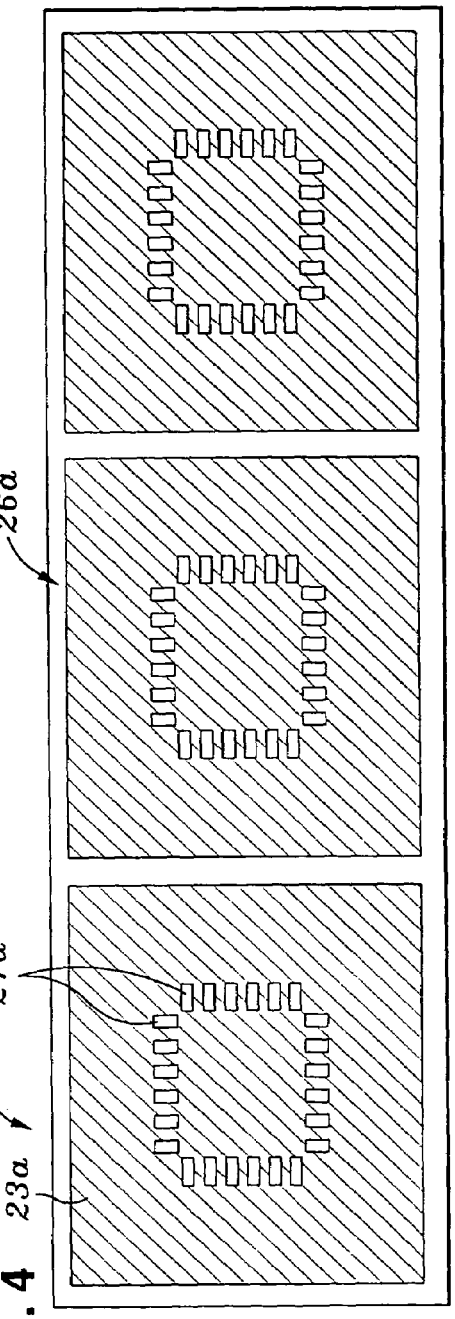
FIG. 4 is a top plan view of a leadframe strip defining multiple substrates formed in accordance with a second embodiment of the present invention.
Figure 5:
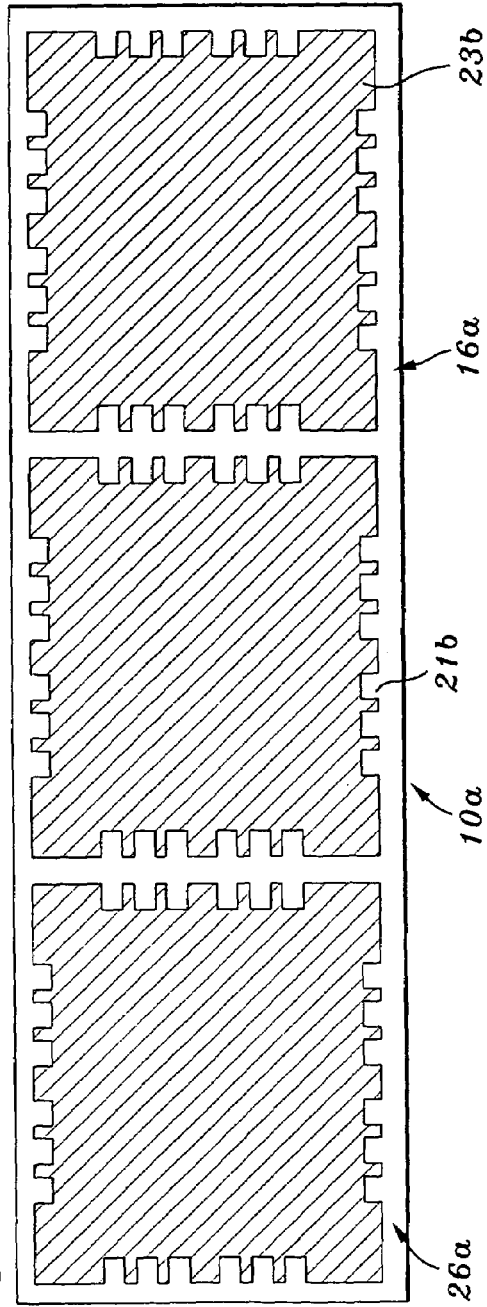
FIG. 5 is a bottom plan view of the leadframe strip shown in FIG. 4.
Figure 6:
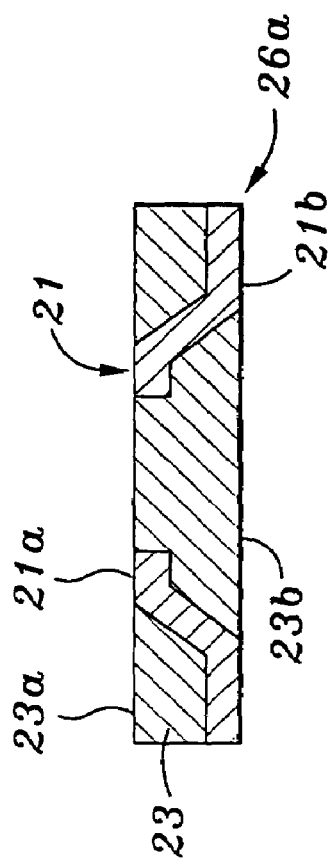
FIG. 6 is a cross-sectional view of one of the substrates of the leadframe strips shown in FIGS. 4 and 5.

Referring now to FIGS. 4–6, there is shown a leadframe strip 10a defining multiple substrates 26a formed in accordance with a second embodiment of the present invention. The primary distinction between the substrate 26a and the above-described substrate 26 is that the leads 21 of the leadframe 16a of each substrate 26a are formed to include a downset such that the inner and outer end portions of each lead 21 extend along respective ones of a spaced, generally parallel pair of planes as best seen in FIG. 6. Thus, in each substrate 26a of the second embodiment, the compound layer 23 thereof is filled within the corresponding leadframe 16a such that the top surface 23a of the compound layer 23 extends in generally flush or co-planar relation to the generally planar top surfaces 21a of the inner end portions of the leads 21. Similarly, the bottom surface 23b of the layer 23 extends in generally co-planar relation to the generally planar bottom surfaces 21b of the outer end portions of the leads 21. The angled sections of the leads 21 extending between the inner and outer end portions thereof are completely covered or encapsulated by the layer 23.

Figure 7:
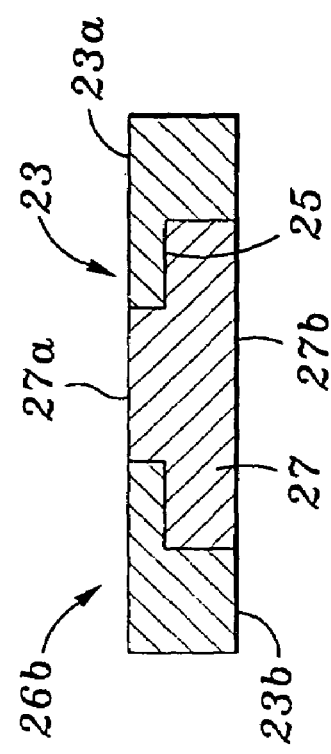
FIG. 7 is a cross-sectional view of a substrate formed in accordance with a third embodiment of the present invention.

Referring now to FIG. 7, there is shown in cross-section a substrate 26b constructed in accordance with a third embodiment of the present invention. The substrate 26b of the third embodiment is similar to the substrate 26 of the first embodiment, except that each of the leads 23 of the substrates 26b is half-etched to form a recessed shoulder 25. In the substrate 26b, the top surface 27a of the compound layer 27 thereof extends in generally co-planar relation to the top surfaces 23a of the leads 23. Similarly, the bottom surface 27b of the layer 27 extends in generally co-planar relation to the bottom surfaces 23b of the leads 23. The layer 27 completely covers the recessed shoulder 25 of each lead 23.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A semiconductor package comprising:
   a substrate comprising:
   a plurality of leads which each include opposed, generally planar top and bottom surfaces and an outer end, the leads extending in spaced relation to each other such that gaps are defined therebetween; and
   a compound layer filled within the gaps defined between the leads and defining opposed, generally planar top and bottom surfaces;
   the substrate including a plurality of peripheral edge segments collectively defined by the compound layer and the outer ends of the leads, a continuous, generally planar top substrate surface collectively defined by the top surfaces of the leads and compound layer, and a continuous, generally planar bottom substrate surface collectively defined by the bottom surfaces of the leads and compound layer, the top and bottom surfaces of the substrate extending to the peripheral edge segments thereof; and
   a semiconductor die attached to the top surface of the substrate and electrically connected to at least some of the leads.

2. The semiconductor package of claim 1 wherein:
   the leads each further include an inner end, with the leads being segregated into multiple sets which are arranged such that the inner ends collectively define a generally square central region which is filled with the compound layer; and
   the semiconductor die is attached to the top surface of a portion of the compound layer which is filled within the central region.

3. The semiconductor package of claim 2 wherein the semiconductor die is electrically connected to the top surfaces of at least some of the leads through the use of conductive wires.

4. The semiconductor package of claim 1 further comprising an optical subassembly mounted to the top substrate surface and covering the semiconductor die.

5. The semiconductor package of claim 1 further including means formed on each of the leads for facilitating a mechanical interlock to the compound layer.

6. The semiconductor package of claim 5 wherein the mechanical interlock means comprises angled side surfaces formed on each of the leads as a result of a chemical etching process.

7. The semiconductor package of claim 5 wherein the mechanical interlock means comprises burrs formed on side surfaces of each of the leads as a result of a mechanical stamping process.

8. The semiconductor package of claim 1 wherein each of the leads has a generally trapezoidal cross-sectional configuration.

9. In a semiconductor package including a semiconductor die, the improvement comprising a substrate for supporting the semiconductor die, the substrate comprising:
   a plurality of leads which each include opposed, generally planar top and bottom surfaces and an outer end, the leads extending in spaced relation to each other such that gaps are defined therebetween; and
   a compound layer filled within the gaps defined between the leads and defining opposed, generally planar top and bottom surfaces;
   the top surface of the compound layer and the top surfaces of the leads extending in generally co-planar relation to each other and the bottom surface of the compound layer and the bottom surfaces of the leads extending in generally co-planar relation to each other such that the substrate includes a plurality of peripheral edge segments collectively defined by the compound layer and the outer ends of the leads, a continuous, generally planar top substrate surface collectively defined by the top surfaces of the leads and the compound layer, and a continuous, generally planar bottom substrate surface collectively defined by the bottom surfaces of the leads and the compound layer, the top and bottom surfaces of the substrate extending to the peripheral edge segments thereof.

10. The substrate of claim 9 wherein the leads each further include an inner end, with the leads being segregated into multiple sets which are arranged such that the inner ends collectively define a generally square central region which is filled with the compound layer.

11. The substrate of claim 9 further including means formed on each of the leads for facilitating a mechanical interlock to the compound layer.

12. The substrate of claim 11 wherein the mechanical interlock means comprises angled side surfaces formed on each of the leads as a result of a chemical etching process.

13. The substrate of claim 11 wherein the mechanical interlock means comprises burrs formed on side surfaces of each of the leads as a result of a mechanical stamping process.

14. The substrate of claim 9 wherein each of the leads has a generally trapezoidal cross-sectional configuration.

15. A method of manufacturing a semiconductor package, comprising the steps of:
   a) providing a plurality of leads which each include an outer end, the leads extending in spaced relation to each other such that gaps are defined therebetween;
   b) applying a compound layer to the leads such that the gaps defined therebetween are filled with the compound layer, and the leads and the compound layer collectively form a substrate including a plurality of peripheral edge segments collectively defined by the compound layer and the outer ends of the leads, a continuous, generally planar top substrate surface and a continuous, generally planar bottom substrate surface, the top and bottom substrate surfaces of the substrate extending to the peripheral edge segments thereof;
   c) attaching a semiconductor die to the top substrate surface; and
   d) electrically connecting the semiconductor die to at least some of the leads.

16. The method of claim 15 wherein step (a) is completed through the use of a chemical etching process.

17. The method of claim 15 wherein step (a) is completed through the use of a mechanical stamping process.

18. The method of claim 15 further comprising the step of:
   e) attaching an optical subassembly to the top substrate surface such that the optical subassembly covers the semiconductor die.

19. The method of claim 15 wherein step (d) is accomplished through the use of conductive wires.

* * * * *